(12) United States Patent
Cheung et al.

(10) Patent No.: US 7,423,569 B2
(45) Date of Patent: Sep. 9, 2008

(54) METHOD AND SYSTEM FOR A CONTROL SCHEME ON POWER AND COMMON-MODE VOLTAGE REDUCTION FOR A TRANSMITTER

(75) Inventors: Yee Ling Cheung, Irvine, CA (US); Kevin T. Chan, Pasadena, CA (US); Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 159 days.

(21) Appl. No.: 11/409,277

(22) Filed: Apr. 24, 2006

(65) Prior Publication Data

US 2006/0246860 A1  Nov. 2, 2006

Related U.S. Application Data

(60) Provisional application No. 60/673,810, filed on Apr. 22, 2005.

(51) Int. Cl.
*H03M 1/66* (2006.01)

(52) U.S. Cl. .................................... 341/144; 341/136
(58) Field of Classification Search ................. 341/136, 341/144; 725/111; 330/51
See application file for complete search history.

(56) References Cited

U.S. PATENT DOCUMENTS

| 6,433,721 | B2* | 8/2002 | Katada ........................ 341/144 |
| 6,603,417 | B2* | 8/2003 | Greig ........................... 341/136 |
| 6,747,510 | B2* | 6/2004 | Jantzi et al. ................... 330/51 |
| 6,903,671 | B2* | 6/2005 | Kwon et al. ................. 341/136 |
| 2002/0188957 | A1* | 12/2002 | Jantzi et al. .................. 725/111 |

* cited by examiner

*Primary Examiner*—Jean B Jeanglaude
(74) *Attorney, Agent, or Firm*—Sterne, Kessler, Goldstein & Fox PLLC

(57) ABSTRACT

Provided is a method and system for controlling current characteristics in a transceiver having a transmitter. The method includes identifying a phase control signal from an adjacent current cell preceding the particular current cell in time and logically ORing the phase control signal from the preceding cell with a phase control signal from the particular current cell.

8 Claims, 12 Drawing Sheets

METHOD AND SYSTEM FOR A CONTROL SCHEME ON POWER AND COMMON-MODE VOLTAGE REDUCTION FOR A TRANSMITTER

CROSS-REFERENCE TO RELATED APPLICATIONS

This application claims the benefit of U.S. Provisional Application No. 60/673,810, filed Apr. 22, 2005, entitled "Method and System for a Control Scheme on Power and Common-Mode Voltage Reduction for a transmitter," which is incorporated by reference herein in its entirety.

BACKGROUND OF THE INVENTION

1. Field of the Invention

The present invention relates to power saving techniques for high speed transmitters.

2. Related Art

In conventional gigabit (e.g. Ethernet) transmitters, current-mode digital to analog converter (DAC) architecture is implemented together with power saving features. These power saving features allow the transmitter to efficiently operate in different modes, namely class-A, class-AB, and class-B modes. In a current-mode transmitter, the differential output current defines the transmitted symbols. Desirably, common-mode current does not contribute to the definition of the transmitted symbols. Also, in these conventional transmitters, the common-mode current is desirably kept as low as possible to minimize the power consumption. Ideally, the common-mode current should be zero.

In a conventional analog front end (AFE), which typically includes a conventional transmitter, inputs of the receiver are connected through a hybrid (echo canceller) circuit to the transmitter's outputs. This connection typically occurs across a duplex communications channel, such as those used in gigabit units. The hybrid circuit cancels out the echo signals traveling back through the output of the transmitter to the receiver inputs. This hybrid circuit, however, is only effective in canceling the differential signal. It does not cancel any undesirable common-mode signals.

The transmitter DAC (TXDAC) that operates in a class-AB or a class-B mode substantially varies its output common-mode voltage as its idle output cells are operated in lower standby (common-mode) current to save power. In class-A mode, the TXDAC is operated at a constant common-mode current that contributes no common-mode voltage variation, but consumes more power. In conventional TXDACs, none of the currently available class-AB, class-B, nor class-A modes, are considered to be efficient from a power savings perspective.

What is needed, therefore, is a method and system that provides an efficient common-mode voltage suppression scheme that will facilitate more efficient class-AB, class-B, and class-A operation in TXDACs. It is desirable that such common-mode voltage suppression techniques, implemented within the TXDAC, will reduce the need for the AFE's receiver to reject common-mode voltages.

BRIEF SUMMARY OF THE INVENTION

Consistent with the principles of the present invention, as embodied and broadly described herein, the present invention includes a method for activating a particular current cell within a plurality of current cells. Each cell is configurable for operating in different modes. The method includes identifying a phase control signal from an adjacent current cell preceding the particular current cell in time and logically ORing the phase control signal from the preceding cell with a phase control signal from the particular current cell.

Further features and advantages of the present invention as well as the structure and operation of various embodiments of the present invention, as described in detail below with reference to the accompanying drawings.

BRIEF DESCRIPTION OF THE DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

Figure 4:
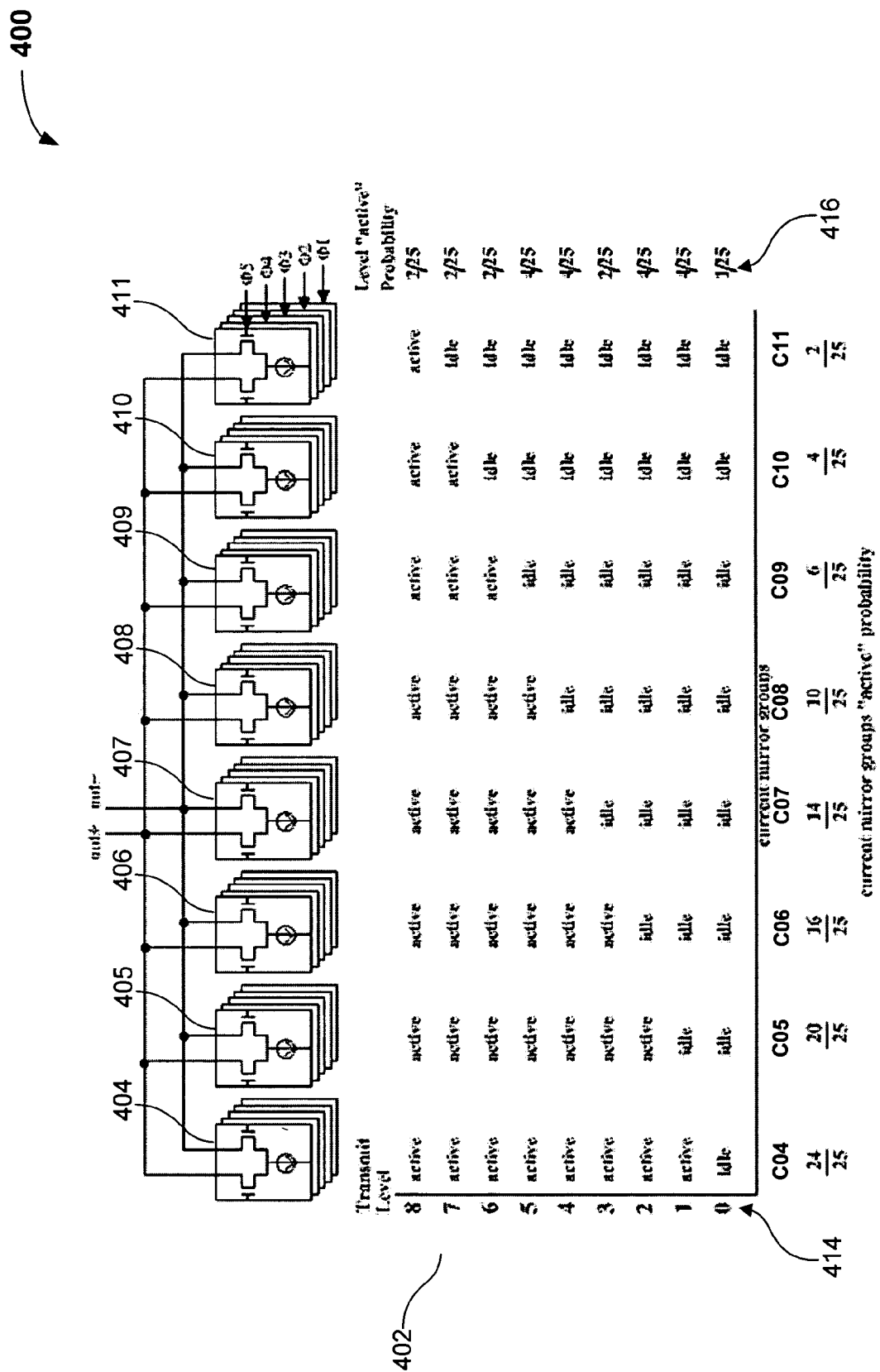
FIG. 4 is a simplified functional block diagram of a TXDAC and corresponding transmit symbol levels in accordance with an embodiment of the present invention.
Figure 8:
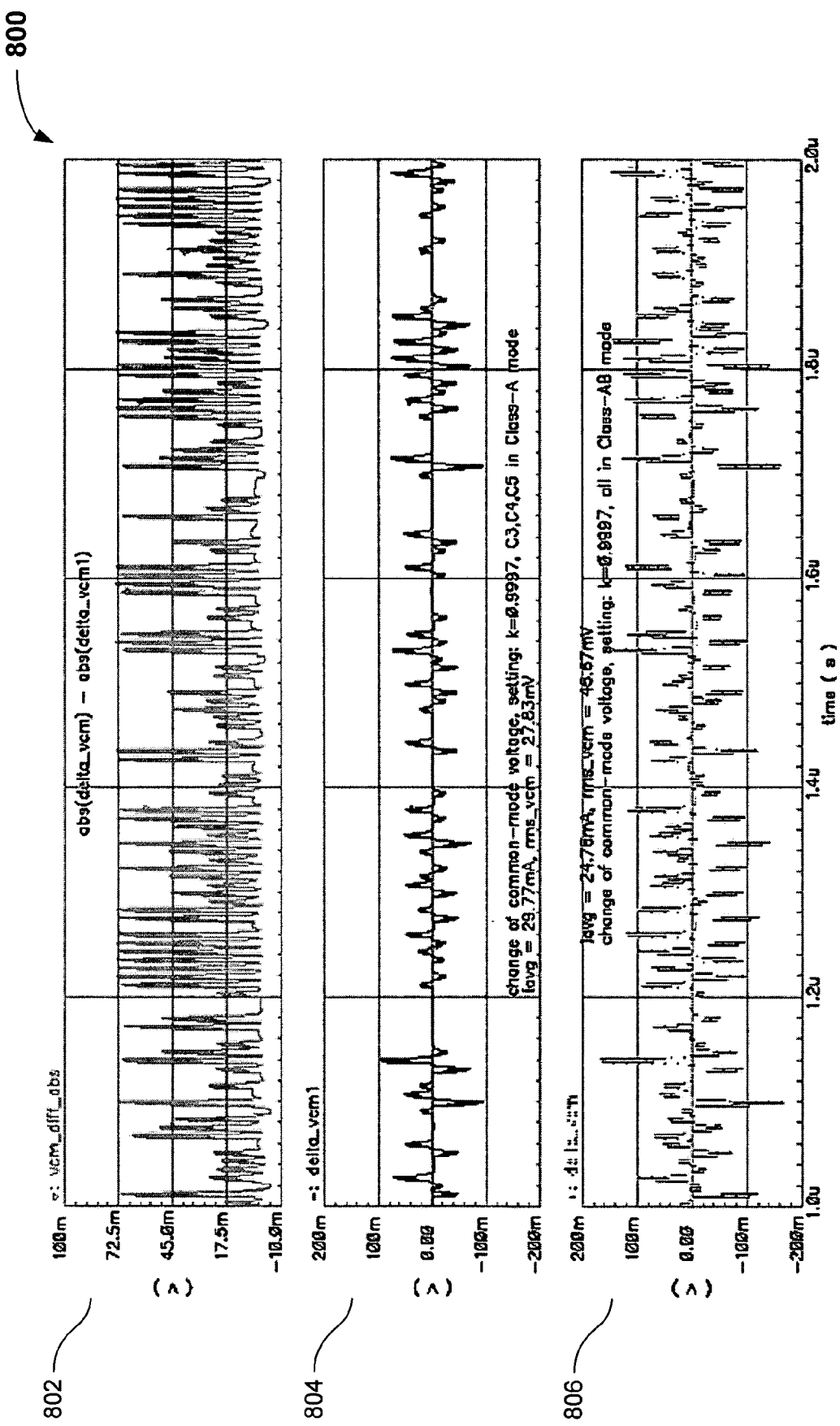
Figure 9:
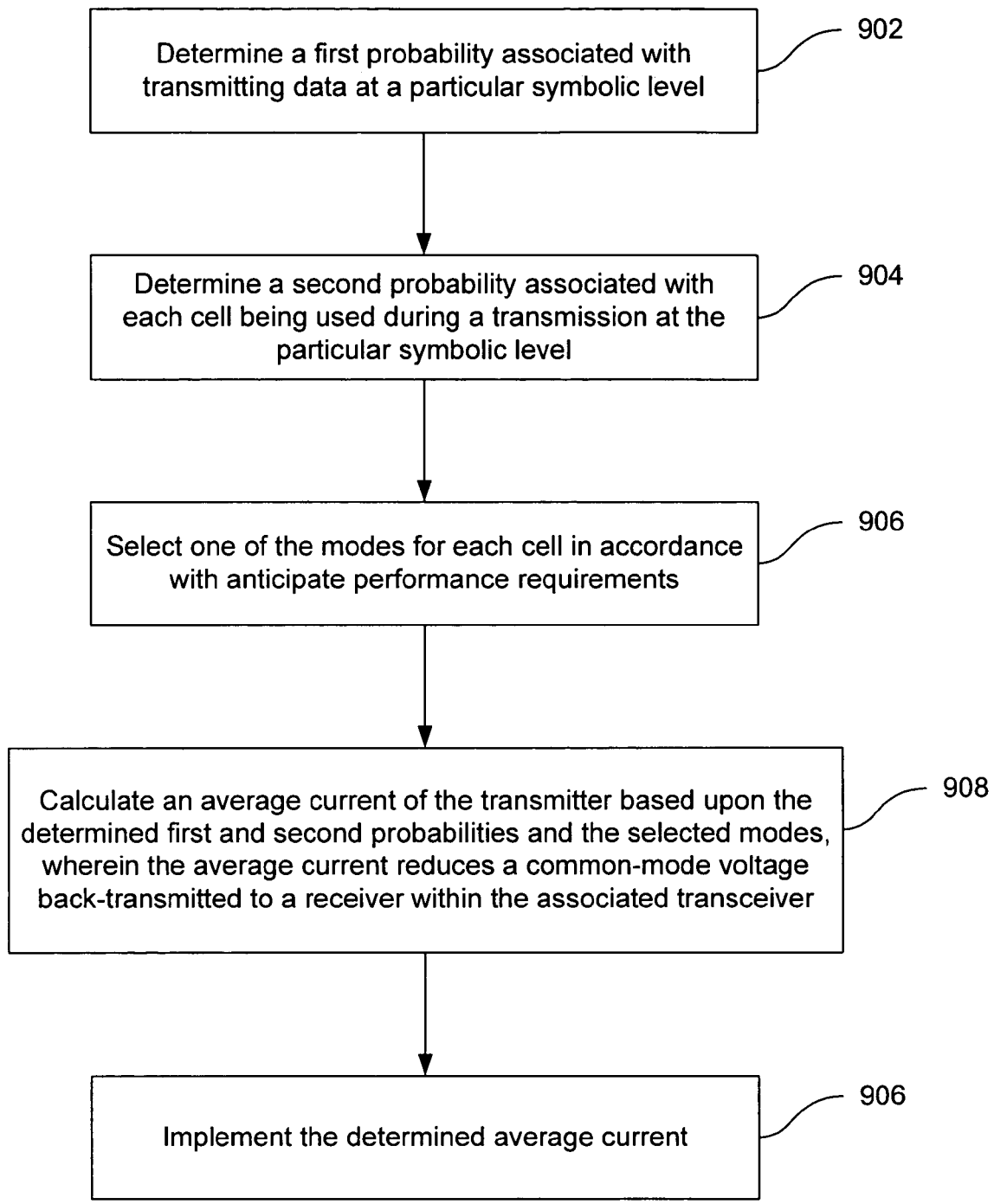
Figure 10:
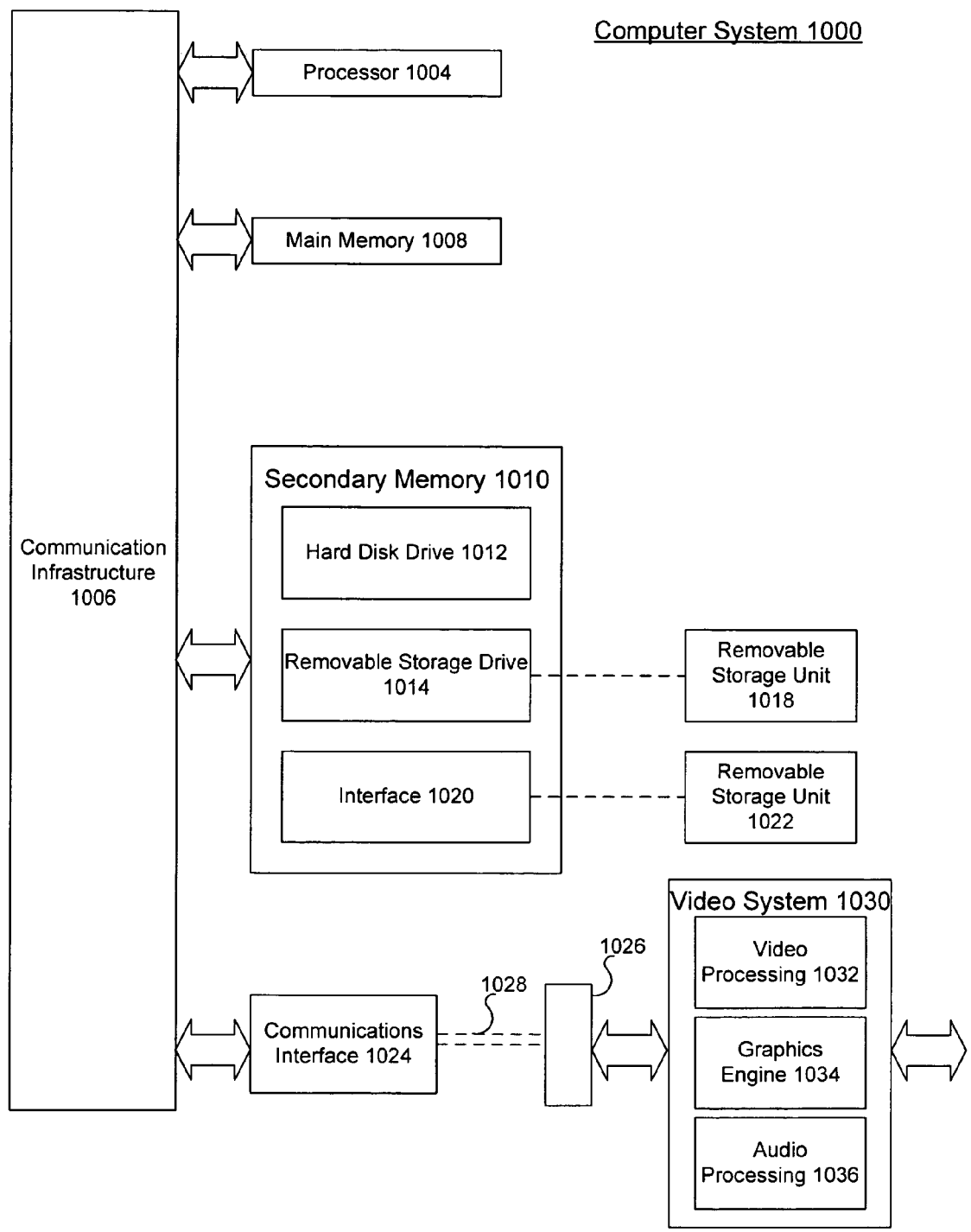
Figure 11:
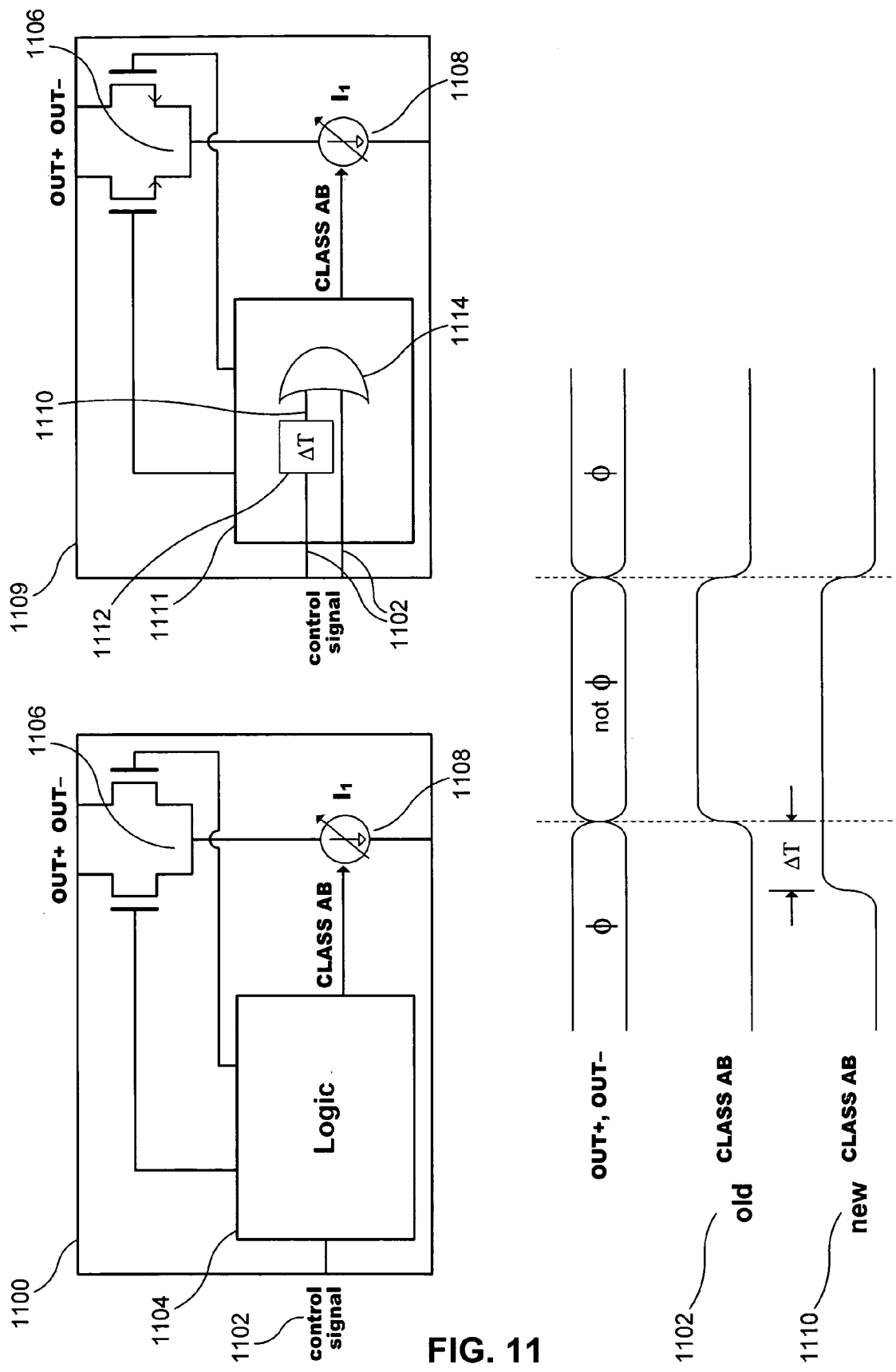
Figure 12:
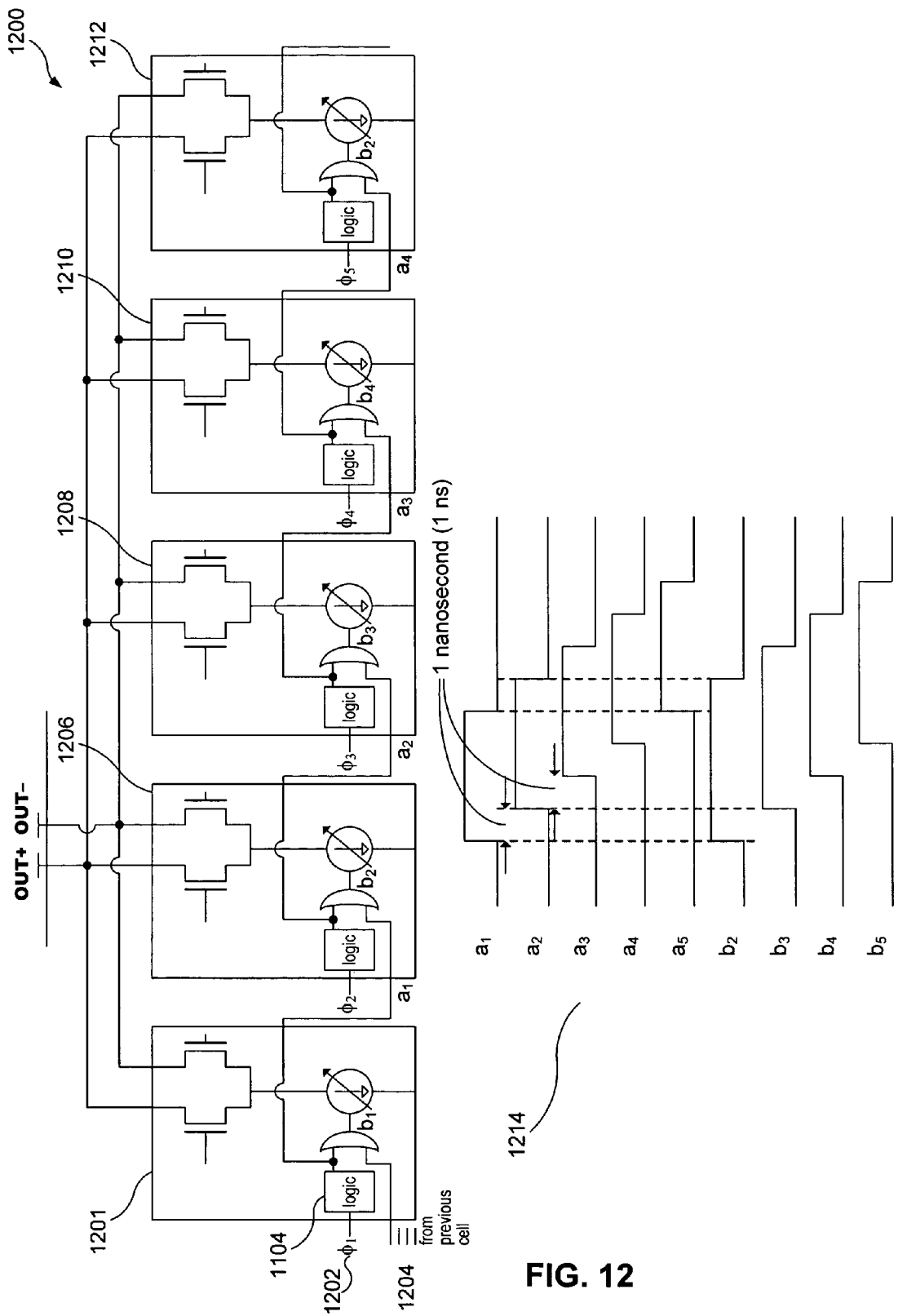

FIG. 8 includes plots of output voltage values from a simulation of the TXDAC illustrated in FIG. 4 in accordance with an embodiment of the present invention;

FIG. 9 is a flowchart of an exemplary method of practicing an embodiment of the present invention;

FIG. 10 is a block diagram illustration of an exemplary computer system on which the present invention can be practiced;

FIG. 11 is simplified block diagram illustration of a control signal scheme in accordance with an embodiment of the present invention; and FIG. 12 is an alternative approach to the control signal scheme illustrated in FIG. 11.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention.

Thus, the operation and behavior of the present invention will be described with the understanding that modifications and variations of the embodiments are possible, given the level of detail presented herein.

Figure 1:
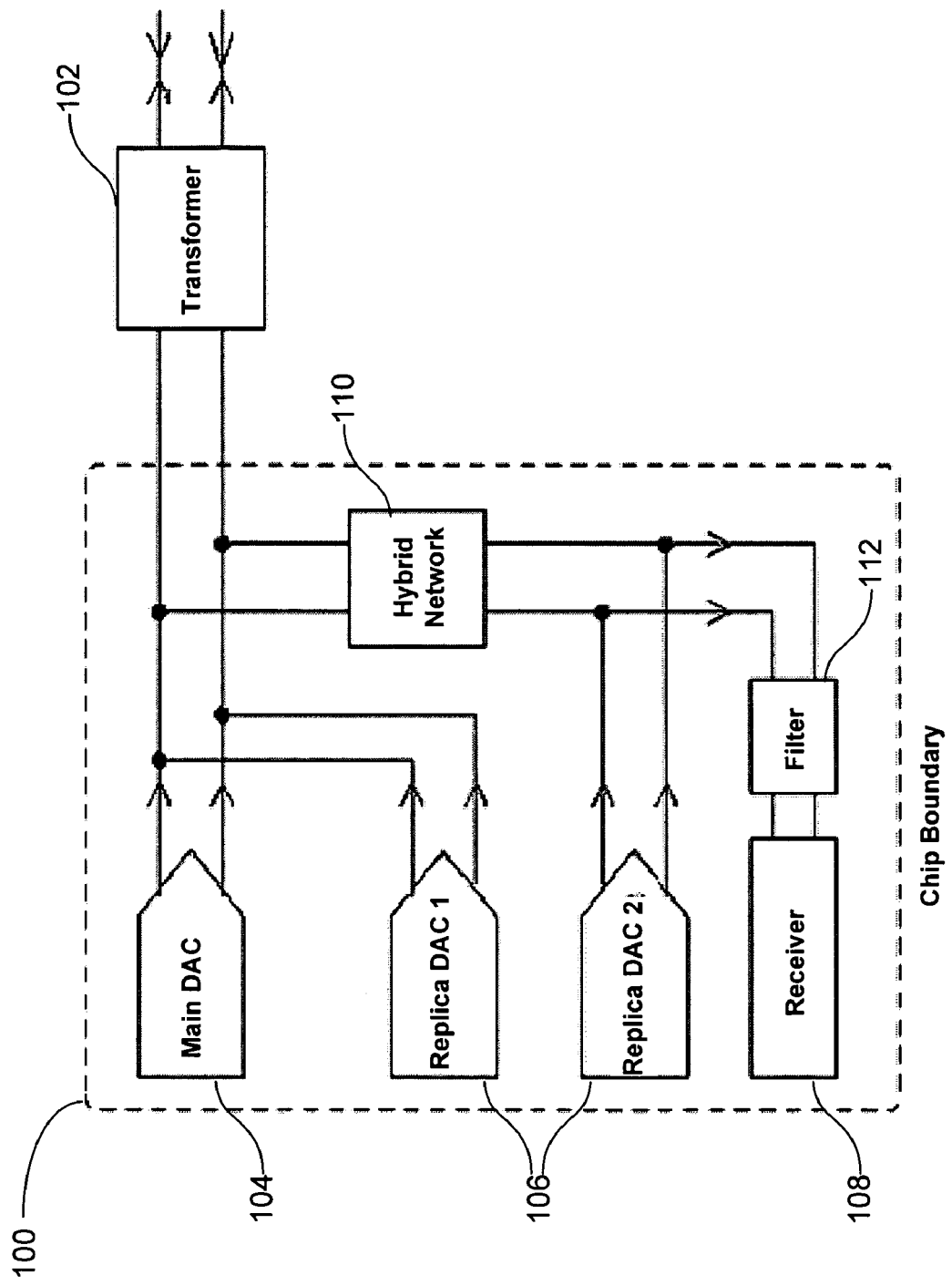
FIG. 1 is a simplified block diagram of an AFE including a gigabit transmitter and a receiver constructed in accordance with an embodiment of the present invention.

FIG. 1 is a simplified block diagram of an AFE system (transceiver) 100 constructed in accordance with an embodiment of the present invention. The AFE system 100 is coupled to a transformer 102. The AFE 100 includes a main transmitter DAC (e.g. TXDAC) 104 connected to replica DACs 106 and to a receiver 108. The TXDAC 104 converts received digital words into analog signals and transmits the analog signals through the transformer 102 to an external component (not shown). Since the transformer 102 is not ideal, leakage inductance occurs.

The leakage inductance of the transformer 102 becomes a central factor in creating variations in the common-mode current to common-mode voltage and adversely effects the operation of the receiver.

The present invention provides a power savings control technique that operates based upon the probability of transmitted symbols. This technique optimizes the power savings within the transmitter 104, while minimizing variations in the common-mode voltage to the receiver 108.

The AFE 100 also includes a hybrid network 110, which is used to cancel out any differential signals returning back into the receiving path from the transformer 102. The hybrid network 110, however, cannot cancel common-mode voltage input signals, which are produced from a combination of effects of the transformer 102 and artifacts from the TXDAC 104.

As known in the art, a five level pulse amplitude modulation (PAM-5) scheme is used in gigabit Ethernet transmissions. During an Ethernet transmission, each of the PAM-5 symbols input to the TXDAC 104 is represented by −2, −1, 0, 1, and 2, and has an equal probability of being transmitted. Before transmission, these PAM-5 symbols are filtered by a partial response finite impulse response (FIR) filter inside the main DAC.

In the exemplary embodiment of FIG. 1, the FIR filter has a transfer function of $0.75+0.25z^{-1}$. This particular transfer function was selected for purposes of illustration only and in no way limits or restricts the present invention to this value. The transfer function $0.75+0.25z^{-1}$ generates 17 distinct symbol output levels, out of 25 possible combinations, that can be output from the transmitter 104. The probability distribution of these 17 output levels is depicted in FIG. 2.

Figure 2:
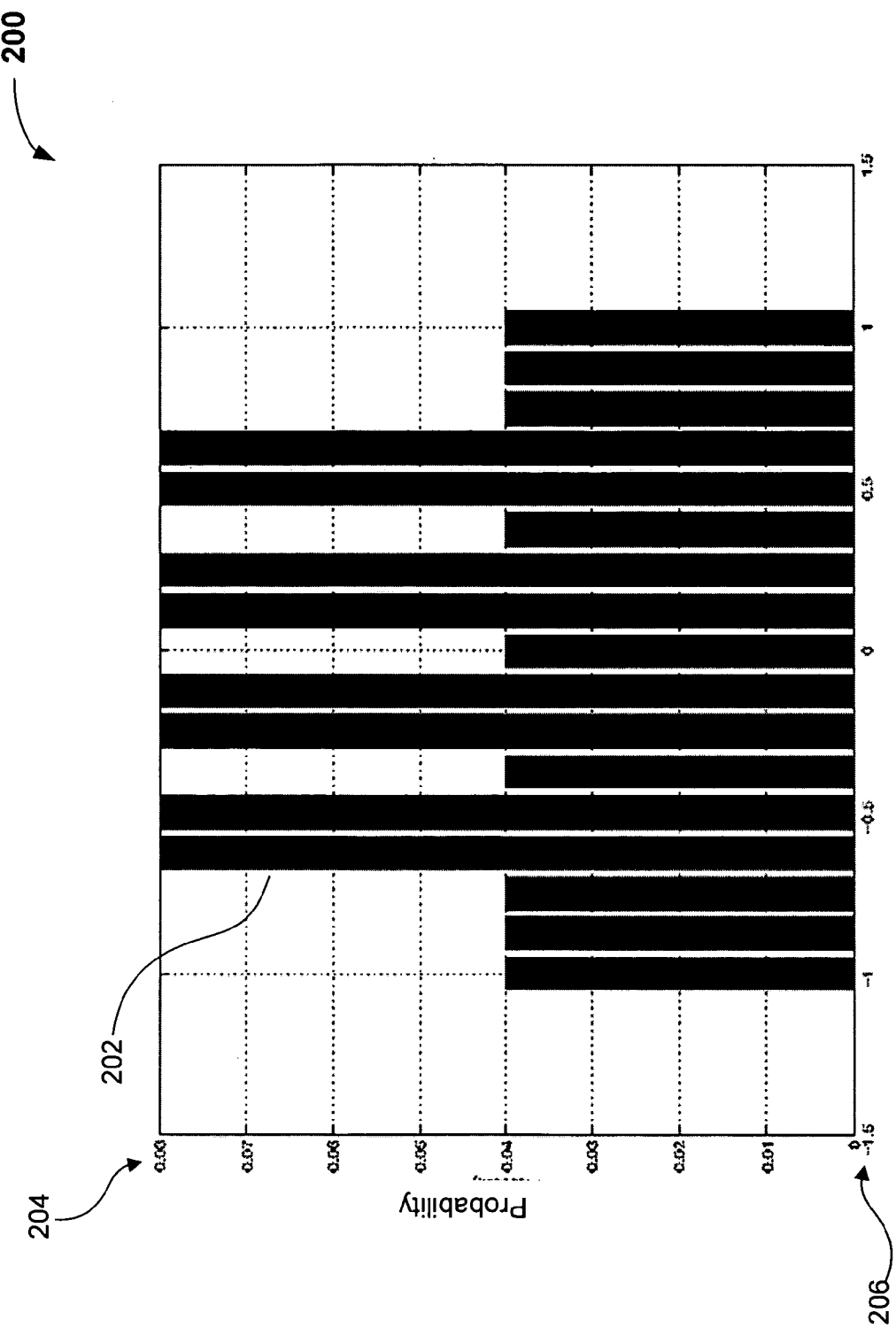
FIG. 2 is a graph of a probability distribution of outputs produced within the AFE illustrated in FIG. 1.

FIG. 2 is a graphical illustration 200 of outputs 202 that can potentially be produced as symbol levels from the TXDAC 104. The probability of any one of the 17 outputs levels 202 occurring is illustrated along an axis 204. Since the output of the transmitter 104 is a differential signal, each output level 202 has inverting and non-inverting components, which are symmetrical about the zero voltage value, along a voltage axis 206.

Figure 3:
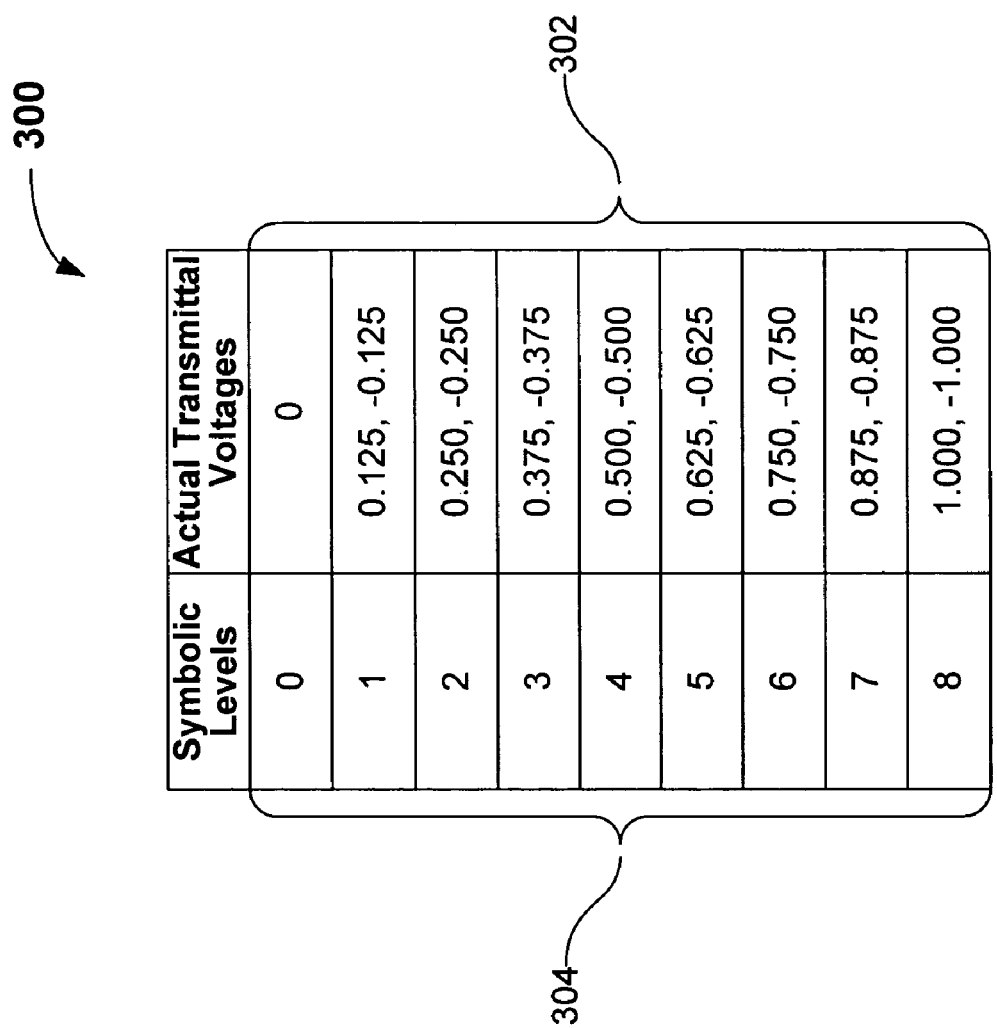
FIG. 3 is a tabular illustration of scaled down voltage levels representative of the probability distributions illustrated in FIG. 2.

In order to match the transmit level of a one volt peak differentially, the output levels 202 are scaled by one-half. The scaled down voltage levels are −1 volt, −0.875 volts, −0.750 volts, −0.625 volts, −0.500 volts, −0.375 volts, −0.250 volts, 0.750 volts, 0.875 volts, and 1 volt. FIG. 3 is a tabular illustration of this principle.

More specifically, FIG. 3 provides a tabular illustration 300 of actual transmitted voltage values associated with the output levels 202, also known as symbolic levels. In the table 300, symbolic levels 304 are associated with actual transmitted voltages 302.

In the table 300 of FIG. 3, polarity is unimportant because the same output cells are used to transmit the absolute amplitude. In essences, polarity is normalized by steering the current to either a positive or negative terminal. Hence, both the positive and negative outputs have the same magnitude and can be represented by one symbolic level in the analysis that follows below.

FIG. 4 is an illustration 400 of a functional diagram of the main TXDAC 104. The illustration 400 includes individual probabilities 402 of the different symbolic levels 202 shown in FIG. 3. In FIG. 4, the TXDAC 104 is comprised of 8 current cell groups 404-411. Each of the current cell groups 404 through 411 further subdivides into 5 current cells, as indicated in FIG. 4. The 5 current cells are asserted by 5 different clock signals Φ1-Φ5 that are separated from each other by about 1 nanosecond (ns), for example. The 5 subgroup current cells are individually asserted within the same cell group in order to control the rise and fall times of the transmitted signal.

The graph 402 also includes 8 columns C04 through C11, which are representative of current mirror group probabilities. That is, each of the columns C04 through C11, of the graph 402, shows the state of the corresponding cell group 404 through 411, where different symbolic levels are being transmitted.

For example, the column C07 illustrates that the cell group 407 is active while the symbolic levels 4 through 8 are being transmitted. On the other hand, the cell group 407 is idle while symbolic levels 0 through 3 are being transmitted. The graph 402 also illustrates that the probability of the current cell group 407, as indicated in C07, being in an active state is 14/25. When reading the chart 402 horizontally, it conveys information regarding which of the cell groups 404 through 411 are involved in transmitting a particular symbolic level.

For example, to transmit a symbolic level 4, the cell groups 404 through 407 are active, while cell groups 408 through 411 are idle. Additionally, the chart 402 conveys that the probability of transmitting the symbolic level 4 is 4/25. The symbol transmit levels are indicated along a vertical axis 414 on the left side of the chart 402 and the level of active probabilities are illustrated in a column 416 along the right side of the chart 402.

The chart 402 of FIG. 4 also reveals that some of the current cell groups 404 through 411 have a higher active probability than others. The active probabilities of current cell groups 404 through 411 are plotted in FIG. 5.

Figure 5:
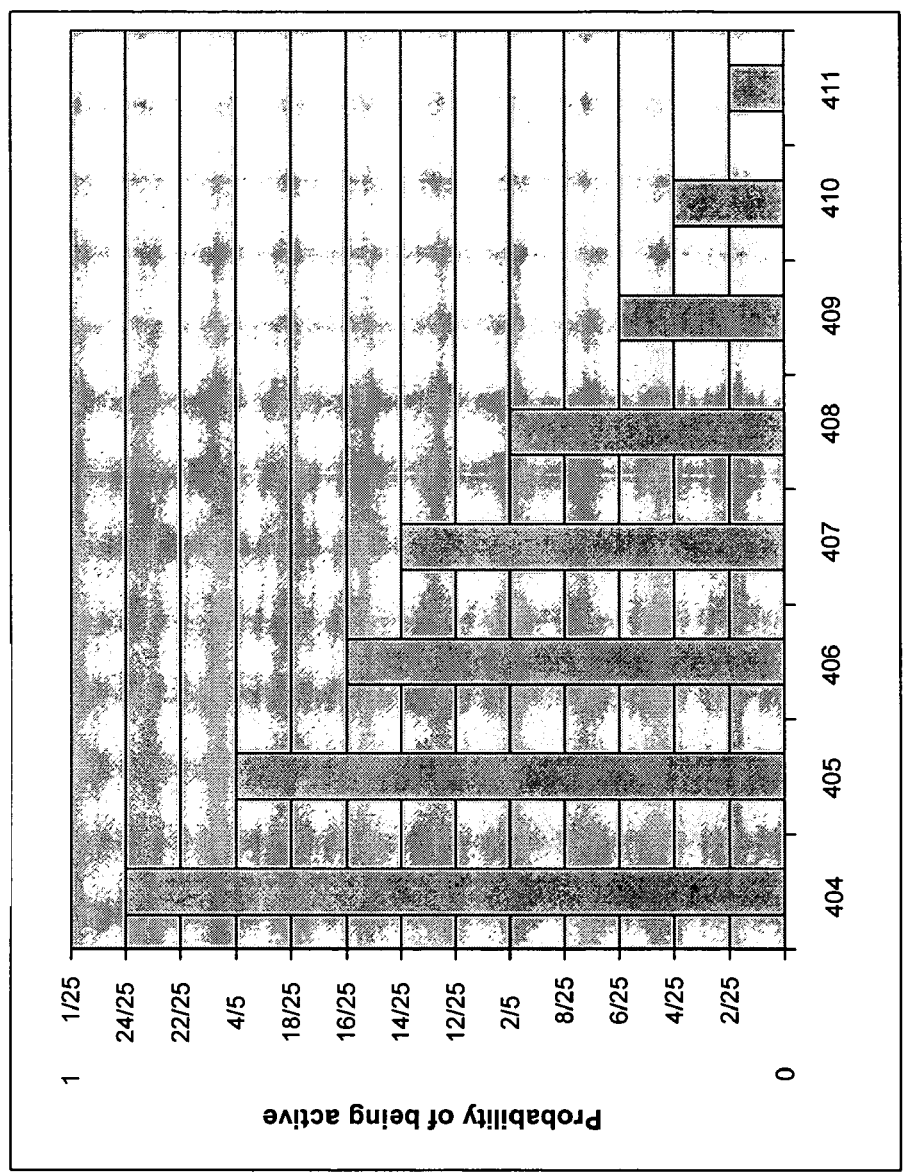
FIG. 5 is a graphical illustration of specific probabilities associated with the TXDAC illustrated in FIG. 4.

FIG. 5 is a graphical illustration 500 conveying the probability of each of the current cell groups 404-411 being active during symbol transmission. For example, FIG. 5 illustrates that the current cell groups 404 and 405 are active most of the time. Therefore, the contribution of the current cell groups 404 and 405 to save power is relatively insignificant as they are most likely to be active during a transmission. Since the current cell groups 404 and 405 are not switching between active and idle states frequently, variations in the common-mode voltage are unlikely.

The graph 500 conveys that the current cell groups 406-408 spend about half of their time toggling between active states and idle states. Thus, the current cell groups 406-408 disrupt the common-mode voltage frequently, since they're switching between the active state and the idle state. This process of "active switching" changes the common-mode current when the TXDAC 104 is operated in either class-AB or class-B modes.

The graph 500 depicts that the current cell groups 409-411, however, are in an idle state most of the time. Thus, the contribution of the current cell groups 409-411 to power savings is potentially enormous. In other words, power savings can be realized by reducing the large amount of stand-by current consumption. The impact to the effects of common-mode voltage is limited, however, because of the infrequent switching.

A closed form equation can thus be derived from the chart 500 of FIG. 5, as will be discussed in greater detail below. The closed form equation can then be used to calculate an average current consumption of the TXDAC 104 based upon the probability of individual current cell groups being active.

The output current of the TXDAC 104 is composed of two components. The output current of the TXDAC 104 includes the current of the idle cells (common-mode current) and current from the active cells (differential current). Data associated with these two current components is tabulated in the illustration of FIG. 6.

Figure 6:
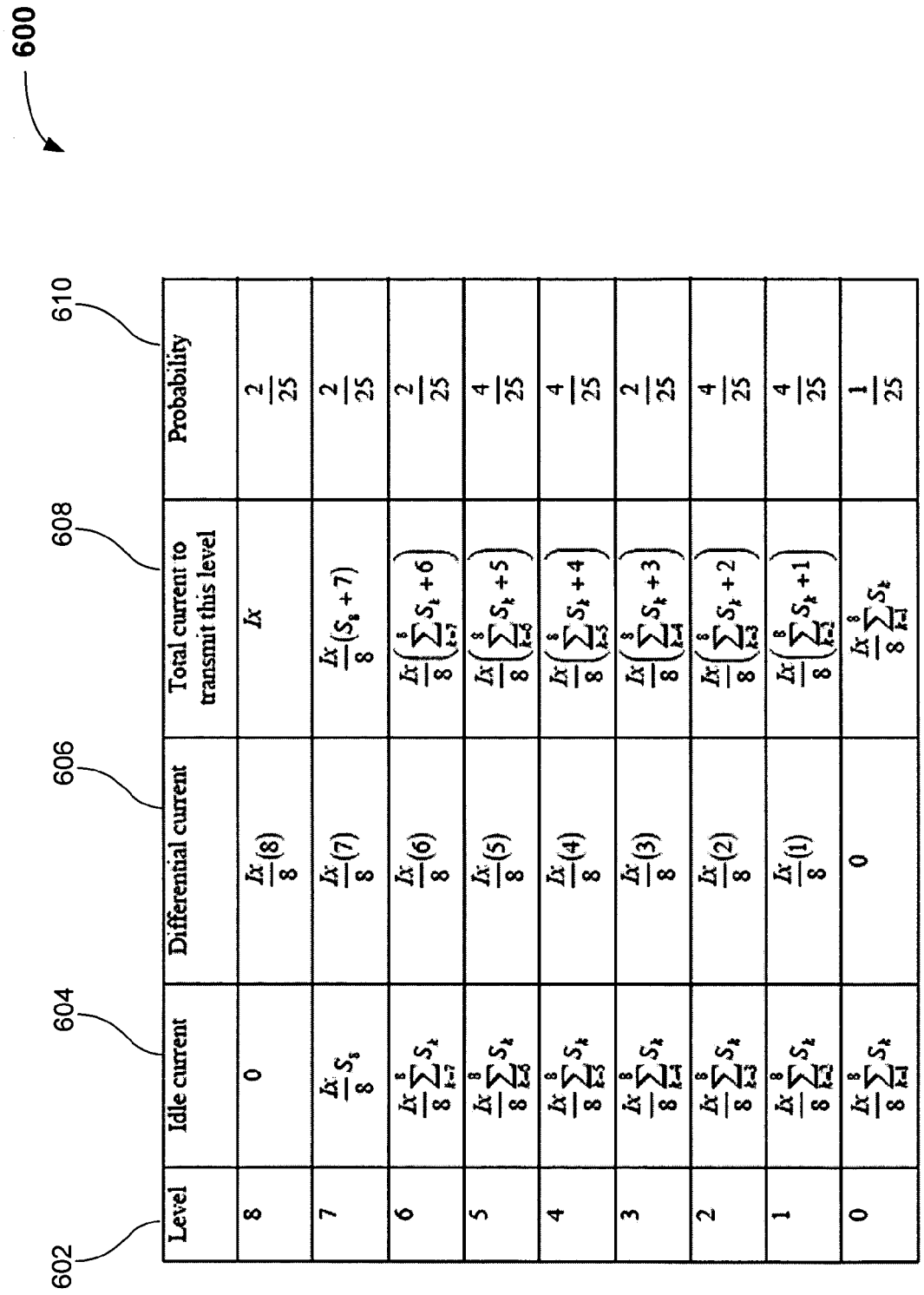
FIG. 6 is a tabular illustration of output current components associated with transmit symbol levels and their probabilities.

FIG. 6 is a tabular illustration 600 of current components and probabilities, associated with the TXDAC 104 of FIG. 1. In FIG. 6, a first column 602 includes the particular symbolic level, followed by a column 604 representative of the idle current, and a column 606 representative of the differential current. Next, the total current to transmit a particular level is computed and shown in a fourth column 608. A fifth column 610 is a probability that the particular symbolic level of column 602 will be transmitted.

$S_k$ is a current scaling factor of a corresponding current cell group $C_k$. $I_x$ is the current of the TXDAC 104 when it is operated in class-A mode. $S_k$ assumes values between 0 and 1. When $S_k=0$, it represents the corresponding current cell group being operated in class-B mode. When $S_k=1$, it represents the corresponding current cell group being operated in the class-A mode. Any values between 0 and 1 correspond to class-AB mode.

The sum of the products of the column 608 (total current to transmit a particular level) and the column 610 (probability of that particular level occurring) produces the average current consumption of the TXDAC 104 over time.

The table 600 FIG. 6, in closed equation form, is represented as:

$$I_{av} = \frac{I_x}{8} \sum_{k=1}^{k=8} S_k \sum_{n=0}^{n=k-1} P_n + \frac{I_x}{8} \sum_{n=1}^{n=8} nP_n$$

where $S_k=1/q_k$
where $q_k$32 current saving factor (values from 1 to infinity)
where $S_k=1$, when in class-A mode
where $S_k=0$, when in class-B mode
where $I_x$ is the transmitter current in class-A mode;
where $S_k$ is the current scaling factor; and
where $P_n$ is the probability of level n being in active state Based upon the above equation, the average current of each of the cell groups 404-411 can be calculated as each of the individual current cells is placed in a different mode. Moreover, an efficient programmable control scheme can be implemented to achieve reasonable power savings and to reduce variations in the common-mode voltage. This efficient programmable control scheme is implemented by selectively configuring each of the cell groups 404-411 into different modes (e.g., class-A, class-AB, or class-B) or assigning different current scaling factors $S_k$.

Figure 7:
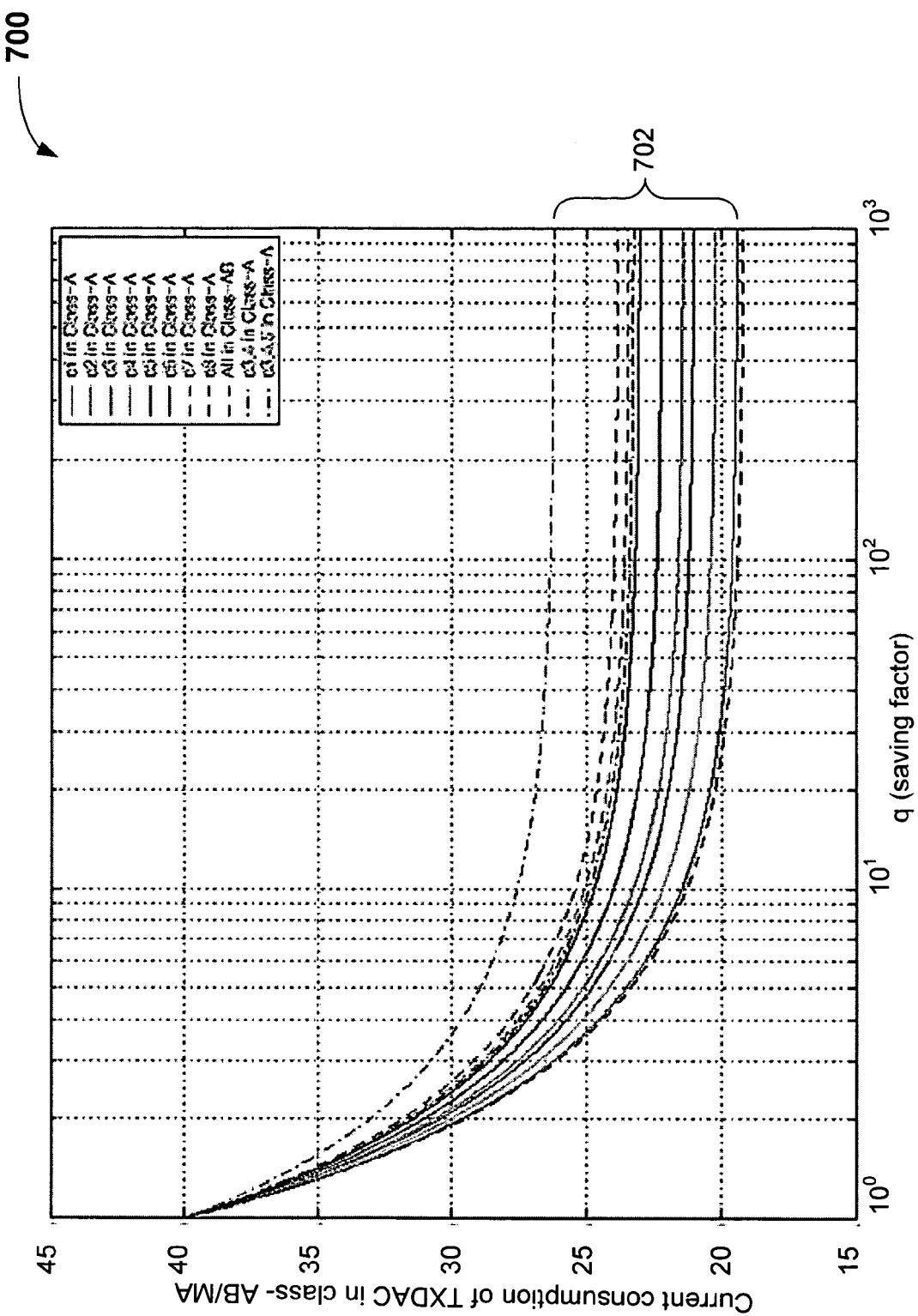
FIG. 7 is a graphical illustration of actual output current values associated with various modes of the TXDAC illustrated in FIG. 4.

To better convey the effects of the current reduction technique of the present invention, a graph of the TXDAC 104 having its current cell groups configured in class-A and class-AB mode, is provided in FIG. 7.

More specifically, FIG. 7 is a graphical illustration 700 of each of the current cell groups (404-411) being configured in accordance with the closed equation above. In the form of current curves 702, FIG. 7 depicts the total average current consumption as a function of the (q) value and mode setting. Further, and for purposes of illustration, the current cell groups 404-411 are configured in various combinations of class-A and class-AB mode.

The various combination of class-A and class-AB were chosen for purposes of illustration only. It is to be understood that numerous other combinations and settings are possible. Additionally, in the exemplary illustration of FIG. 7, it is assumed that $q_k$ is equal to q. In other words, it is assumed that each of the current cell groups 404-411 have the same q (current saving factor) value.

In theory (not shown), the minimum current consumption is obtained by setting all of the current cell groups 404-411 to operate in class-B mode. With the current cell groups 404-411 in class-B mode, the best power savings that can be achieved is approximately 46% of the current consumption relative to the class-A mode. However, excessive distortion in the pure class-B mode operation makes it unsuitable in real application.

In FIG. 7 and at an initial value of q=1, all of the current cells 404-411 were operated in class-A mode. Also at the value of q=1, $I_x$ assumes an initial value of 40 milli-amps (mA). Starting with the initial values of q and $I_x$, several useful data points can be extracted from the graph 700 of FIG. 7.

For example, based on the trend of the curves 702, any further increase of the value q beyond 10 insignificantly reduces the current. Secondly, for any value of q between 1 and 2, the power savings is fairly substantial, as shown in FIG. 7. Next, with the information derived from the graph 700 of FIG. 7, a simulation, using known techniques, can be performed of the TXDAC 104 configured in the different modes noted above.

Using the information derived from the graph 700 of FIG. 7, the variations of the common-mode voltage associated with the different mode settings of the different cell groups 404-411 can be derived. For example, the current cell groups 406-408 switch between active and idle states frequently. The corresponding current consumption, when the current cells 406-408 that corresponds to C3-C5 in FIG. 8 are set to class-A and class-B modes, can be calculated, as shown in FIG. 8.

FIG. 8 is a depiction of oscilloscope screen shots 800 comparing simulation results from the current cell groups 406-408 being configured in different current modes. The difference is 5 mA when q=5. The common-mode voltage variation can be obtained from the simulation results 800 of FIG. 8. With the current cells 406-408 set to class-A, the absolute peak variation is 72.5 milli-volts lower than when set to class-AB mode, as shown in a top curve 802 in FIG. 8.

Based upon the curves 702 of FIG. 7 and the screen shots of FIG. 8, a system user can individually program the current cell groups 404-411. For example, the user can apriorily tailor the current cell group settings to accommodate the current demands of a particular operational environment.

Although the present invention is illustrated based upon the use of eight current cell groups, any appropriate number of current cell groups can be used in practice. Thus, the present invention is not limited to the use of eight current cell groups.

Hence, the amount of current consumed can be controlled and operational modes of individual current cell groups can be selectively set back to class-A in case excessive common-mode voltage variations begin affecting normal operation of the receiver 108.

FIG. 9 is a flowchart of an exemplary method 900 of practicing an embodiment of the present invention. In FIG. 9, a first probability associated with transmitting data at a particular symbolic level, is determined in a step 902. In a step 904, a second probability associated with each cell being used during a transmission at the particular symbolic level, is determined.

Next, one of the modes for each cell is selected in accordance with anticipated performance requirements, as indicated in a step 906. And in a step 908, an average current of the transmitter based upon the determined first and second probabilities and the selected modes, is determined. In step 908, the determined average current reduces a common-mode voltage back-transmitted to a receiver within the associated transceiver. Finally, the determined average current is implemented in step 910.

The following description of a general purpose computer system is provided for completeness. The present invention can be implemented in hardware, or as a combination of software and hardware. Consequently, the invention may be implemented in the environment of a computer system or other processing system.

An example of such a computer system 1000 is shown in FIG. 10. In the present invention, all of the elements depicted in FIGS. 5-6, for example, can execute on one or more distinct computer systems 1000, to implement the various methods of the present invention. The computer system 1000 includes one or more processors, such as a processor 1004. The processor 1004 can be a special purpose or a general purpose digital signal processor.

The processor 1004 is connected to a communication infrastructure 1006 (for example, a bus or network). Various software implementations are described in terms of this exemplary computer system. After reading this description, it will become apparent to a person skilled in the relevant art how to implement the invention using other computer systems and/or computer architectures.

The computer system 1000 also includes a main memory 1008, preferably random access memory (RAM), and may also include a secondary memory 1010. The secondary memory 1010 may include, for example, a hard disk drive 1012 and/or a removable storage drive 1014, representing a floppy disk drive, a magnetic tape drive, an optical disk drive, etc.

The removable storage drive 1014 reads from and/or writes to a removable storage unit 1018 in a well known manner. The removable storage unit 1018, represents a floppy disk, magnetic tape, optical disk, etc. which is read by and written to by the removable storage drive 1014. As will be appreciated, the removable storage unit 1018 includes a computer usable storage medium having stored therein computer software and/or data.

In alternative implementations, the secondary memory 1010 may include other similar means for allowing computer programs or other instructions to be loaded into the computer system 1000. Such means may include, for example, a removable storage unit 1022 and an interface 1020.

Examples of such means may include a program cartridge and cartridge interface (such as that found in video game devices), a removable memory chip (such as an EPROM, or PROM) and associated socket, and other removable storage units 1022 and interfaces 1020 which allow software and data to be transferred from the removable storage unit 1022 to the computer system 1000.

The computer system 1000 may also include a communications interface 1024. The communications interface 1024 allows software and data to be transferred between the computer system 1000 and external devices. Examples of the communications interface 1024 may include a modem, a network interface (such as an Ethernet card), a communications port, a PCMCIA slot and card, etc.

Software and data transferred via the communications interface 1024 are in the form of signals 1028 which may be electronic, electromagnetic, optical or other signals capable of being received by the communications interface 1024. These signals 1028 are provided to the communications interface 1024 via a communications path 1026. The communications path 1026 carries signals 1028 and may be implemented using wire or cable, fiber optics, a phone line, a cellular phone link, an RF link and other communications channels.

In this document, the terms computer program medium and computer readable medium are used to generally refer to media such as the removable storage drive 1014, a hard disk installed in hard disk drive 1012, and the signals 1028. These computer program products are means for providing software to the computer system 1000.

Computer programs (also called computer control logic) are stored in the main memory 1008 and/or the secondary memory 1010. Computer programs may also be received via the communications interface 1024. Such computer programs, when executed, enable the computer system 1000 to implement the present invention as discussed herein. In particular, the computer programs, when executed, enable the processor 1004 to implement the processes of the present invention. Accordingly, such computer programs represent controllers of the computer system 1000.

By way of example, in the embodiments of the invention, the processes/methods performed by signal processing blocks of encoders and/or decoders can be performed by computer control logic. Where the invention is implemented using software, the software may be stored in a computer program product and loaded into the computer system 1000 using the removable storage drive 1014, the hard drive 1012 or the communications interface 1024.

FIG. 11 is simplified block diagram illustration of a control signal scheme in accordance with an embodiment of the present invention. In FIG. 11, a conventional current cell device 1100 is shown. The conventional current cell device 1100 is configured to receive a control signal 1102 as an input to a signal control device 1104. The signal control device 1104 provides an output to a differential pair arrangement 1106 and to a current source 1108, which provides a transmitting current. The conventional current cell device 1100, however, is problematic in that it represents a source of transient distortion residual echo to local receivers.

In an embodiment of the present invention, an improved current cell device 1109 is provided that reduces the transient distortion and reduces the residual echo back to the local receiver. In the current cell device 1109, the control signal 1102 is provided as an input to a logic module 1111. The logic module 1111 includes a predictive device 1112 and a logic device 1114. The logic device 1114 can be implemented, for example, as a logical OR device. The predictive device 1112 receives the control signal 1102 and provides a look-ahead signal 1110 as an output. Predictive devices, such as the device 1112, are well known to those of skill in the art.

The look-ahead signal 1110 has an earlier rising edge to bring the current source 1108 back to the normal transmitting current. In short, the look-ahead signal 1110 is implemented to return the current back to normal. This approach shortens the wake-up time and reduces transmit distortion. The look-ahead signal 1110 is ORd with the control signal 1102 and the resulting signal is provided as a control mechanism for the current source 1108.

The benefit of the technique of FIG. 11 is reduction of transmit distortion during transition and to reduce the residual echoes back to the local receiver. With the early look ahead or wake-up signal, sufficient settling time is allowed for the current source to wake up from standby mode and return to the normal transmit mode. This scheme is implemented in actual silicon.

FIG. 12 is an alternative approach to the control scheme illustrated in FIG. 11. In FIG. 12, the rising and falling edge rate of the transmitter is controlled by clocking 5 different cell groups with clocks separated by one nanosecond. In this case, the current source will be activated one nanosecond earlier to allow sufficient settling time.

In FIG. 12 a current cell group 1200 includes a first current cell device 1201 which is structurally similar to the current cell device 1109 of FIG. 11, and is configured to receive as an input a wake-up signal 1202, discussed above. In the current cell device 1201, a wake-up signal 1204 from a previous current control cell (not shown) is provided as an input to the logic device 1104. In other words, an early signal from a previous phase is provided as an input to the logic device 1114. The arrangement of the current cell device 1201 applies to current cells, such as current cells 1206, 1208, 1210, and 1212, within the group of current cells 1200. In the current cell device 1206, for example, a control signal $a_1$, from the previous current cell device 1201, is logically ORd with a control signal $\phi_2$.

More specifically, the technique of FIG. 12 takes the wake-up signal from one cell (e.g. cell 1201) and ORs it with the wake-up signal from an adjacent cell (e.g. cell 1206). In this manner, cell 1206 is turned on faster. This process continues along the chain of 1208, 1210, and 1212 where the wake-up signal from cell 1206 is then OR'd with the wake-up signal from cell 1208 in order to trigger cell 1208, and so on. Thus, an added feature of the present invention is to use a prior cell wake-up signal and OR it with the current cell wake-up signal and use that to trigger the cell. A more detailed signal timing arrangement 1214 is also shown in FIG. 12.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What we claim is:

1. A current control logic device, comprising;
    predictive logic configured to advance a leading edge of an input signal; and
    a logic device having one input coupled to an output of the predictive logic and another input configured to receive the input signal.

2. The current control logic device of claim 1, wherein the input signal is a wake-up signal; and
    wherein an output of the logic device is configured to be provided as an input to a current source.

3. A method for activating an individual current cell within a plurality of interconnected current cells, the method comprising:
    providing a respective wake-up signal to each of the cells; and
    logically combining particular ones of the respective control signals with a respective control signal output from an adjacent cell.

4. The method of claim 3, wherein the logically combining includes an ORing operation.

5. The method of claim 3, wherein the logically combining includes ORing the particular one of the respective control signals with a respective control signal from a previous cell.

6. An apparatus for activating an individual current cell within a plurality of interconnected current cells, the apparatus comprising:
    means for providing a respective wake-up signal to each of the cells; and
    means for logically combining particular ones of the respective control signals with a respective control signal from an adjacent cell.

7. The apparatus of claim 6, wherein the logically combining includes an ORing operation.

8. The apparatus of claim 6, wherein the logically combining includes ORing the particular one of the respective control signals with a respective control signal from a previous cell.

* * * * *